(12) United States Patent
Kasprzyk

(10) Patent No.: US 9,077,434 B2
(45) Date of Patent: Jul. 7, 2015

(54) WIRELESS COMMUNICATION APPARATUS FOR CONTROLLING AND MONITORING DEVICES REMOTELY

(71) Applicant: Marlon Zbigniew Kasprzyk, Winfield, IL (US)

(72) Inventor: Marlon Zbigniew Kasprzyk, Winfield, IL (US)

(*) Notice: Subject to any disclaimer, the term of this patent is extended or adjusted under 35 U.S.C. 154(b) by 0 days.

(21) Appl. No.: 14/165,727

(22) Filed: Jan. 28, 2014

(65) Prior Publication Data

US 2014/0213320 A1 Jul. 31, 2014

Related U.S. Application Data

(60) Provisional application No. 61/757,306, filed on Jan. 28, 2013.

(51) Int. Cl.
| | |
|---|---|
| *H04B 1/38* | (2015.01) |
| *H04B 1/3816* | (2015.01) |
| *H04B 1/3827* | (2015.01) |
| *H04W 4/00* | (2009.01) |
| *H04W 8/18* | (2009.01) |

(52) U.S. Cl.
CPC ............ *H04B 1/3816* (2013.01); *H04B 1/3827* (2013.01); *H04W 4/003* (2013.01); *H04W 8/183* (2013.01)

(58) Field of Classification Search
CPC ... H04B 1/3827; H04B 1/3816; H04W 8/183; H04W 4/003
USPC .......................................................... 455/558
See application file for complete search history.

(56) References Cited

U.S. PATENT DOCUMENTS

| | | | | |
|---|---|---|---|---|
| 5,790,659 | A * | 8/1998 | Strand ...................... | 379/433.09 |
| 6,173,405 | B1 * | 1/2001 | Nagel .............................. | 726/21 |
| 7,208,916 | B1 * | 4/2007 | Boatwright et al. .......... | 320/150 |
| 8,154,878 | B2 * | 4/2012 | Wang et al. ................... | 361/754 |
| 2007/0244579 | A1 * | 10/2007 | Scharnick et al. ............... | 700/79 |
| 2009/0227203 | A1 * | 9/2009 | Guerreri et al. ................. | 455/39 |
| 2013/0164567 | A1 * | 6/2013 | Olsson et al. ..................... | 429/7 |

* cited by examiner

*Primary Examiner* — Khalid Shaheed

(57) ABSTRACT

A remote acquisition and remote operation (RARO) device utilizes simple mail service (SMS) messages to control connected electronic devices. A cellular modem, which is provided a unique phone number through a subscriber identity module (SIM) card, receives and transmits SMS messages in regards to electronic devices connected to a plurality of ports. A microprocessor translates SMS messages from a user device into electrical signals used to control the connected electronic devices, and translates electrical signals from the connected electronic devices into SMS messages, such that the user can monitor the status of the connected electronic devices. A plurality of relays and a signal converter are also connected to the plurality of ports and assist in the control and monitoring of the connected electronic devices. A power input and power cable provide a primary power source for the RARO device, while a battery supply serves as a back-up power source.

17 Claims, 13 Drawing Sheets

*Management commands*

| | |
|---|---|
| | |
| | |
| | |
| | |
| | |

*Alarm related commands*

| | |
|---|---|
| | |
| | |
| | |

*Remote control commands*

| | |
|---|---|
| | |
| | |
| | |
| | |
| | |
| | |
| | |
| | |
| | |
| | |
| | |
| | |
| | |

*Miscellaneous commands*

| | |
|---|---|
| | |
| | |

FIG. 13

WIRELESS COMMUNICATION APPARATUS FOR CONTROLLING AND MONITORING DEVICES REMOTELY

The current application claims a priority to the U.S. Provisional Patent application Ser. No. 61/757,306 filed on Jan. 28, 2013.

FIELD OF THE INVENTION

The present invention relates generally to a wireless communication device. Furthermore, the present invention can be used to control and monitor any number of electronic devices from a remote location.

BACKGROUND OF THE INVENTION

The use of remotely operated systems has begun to grow over the past few years. Remotely operated systems are being used in a variety of fields such as aviation and healthcare. With the success of systems in these fields the technology has moved into personal use systems. Individuals can now control electrical devices in their home from remote locations. Many smartphones allow a user to send device commands from almost anywhere in the world to control remotely linked devices. These systems most commonly rely on the Internet as the medium for which device commands are sent through. The problem in this, however, is that if a user's smartphone cannot connect to the Internet at the present time, then they will not be able to access and control their remotely linked devices. If a server crashes or if there are issues on the Internet service provider's end, then it is not possible for the individual to monitor and control their remotely linked devices.

Therefore it is the object of the present invention to provide a wireless communication device that operates using radio tower networks. The present invention utilizes simple mail messages to send remote commands from a user's cell phone to a remote acquisition and remote operation (RARO) device. Remote commands sent using simple mail messages are interpreted by a microprocessor and then translated into electronic signals that are used to control devices connected to the RARO device. A variety of electronic devices can be connected to the RARO device such as analog sensors, digital sensors, microphones, speakers, lights, etc.

BRIEF DESCRIPTION OF THE DRAWINGS

FIG. 13 is a diagram depicting a list of examples of SMS commands.

DETAIL DESCRIPTIONS OF THE INVENTION

All illustrations of the drawings are for the purpose of describing selected versions of the present invention and are not intended to limit the scope of the present invention.

Figure 1:
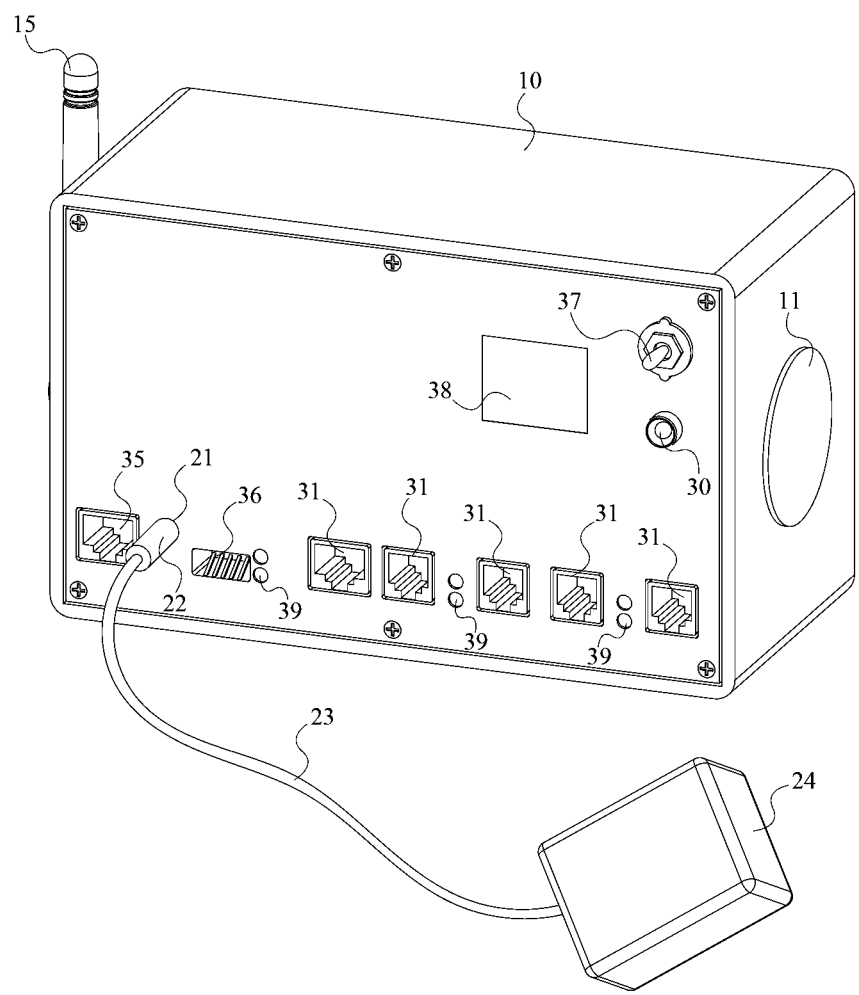
FIG. 1 is a perspective view of the remote acquisition and remote operation (RARO) device.

The present invention is a remote acquisition and remote operation (RARO) device, shown in FIG. 1. The present invention allows for the remote control and monitoring of electronic devices via simple mail service (SMS) messages. A series of electronic devices can be wired to the RARO device and in turn be controlled remotely by a user. By sending SMS message commands to the RARO device, the user can remotely control specific functions of the connected electronic devices.

Figure 3:
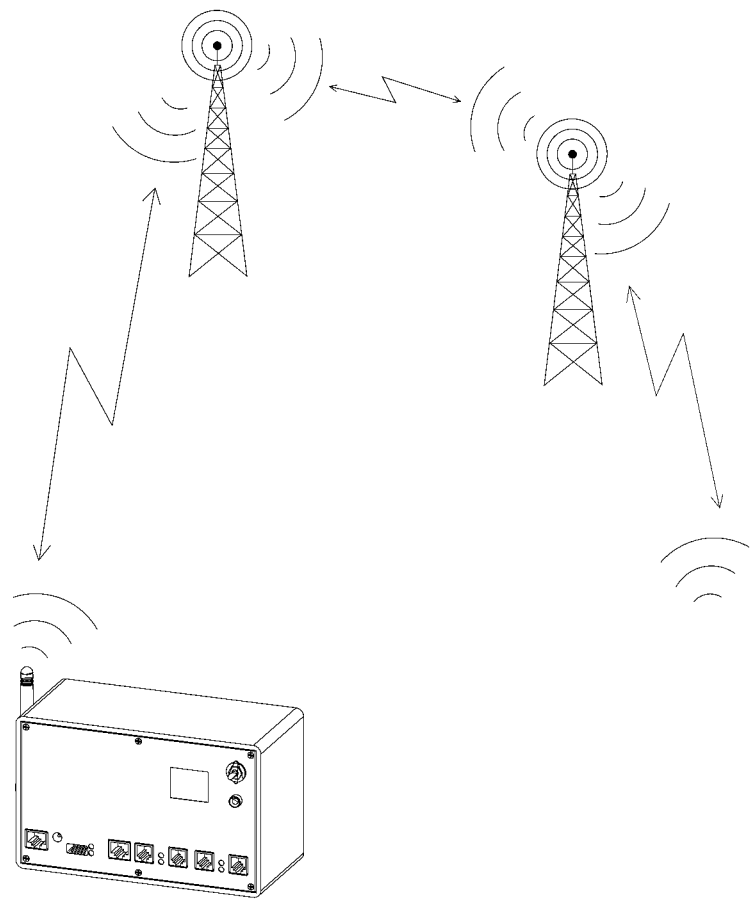
FIG. 3 is a diagram depicting the means of communication between the RARO device and a user device.

In reference to FIG. 3, the RARO device is in communication with at least one user device. Communications between the at least one user device and the RARO device are carried out over a radio tower network using SMS. The RARO device can utilize any radio network infrastructure or other network capable of transmitting SMS messages. In the preferred embodiment of the present invention the at least one user device is a cell phone, however, the at least one user device can be any other electronic device capable of sending and receiving SMS messages. Commands sent to the RARO device are case sensitive, although it is also possible for commands to not be case sensitive.

Figure 2:
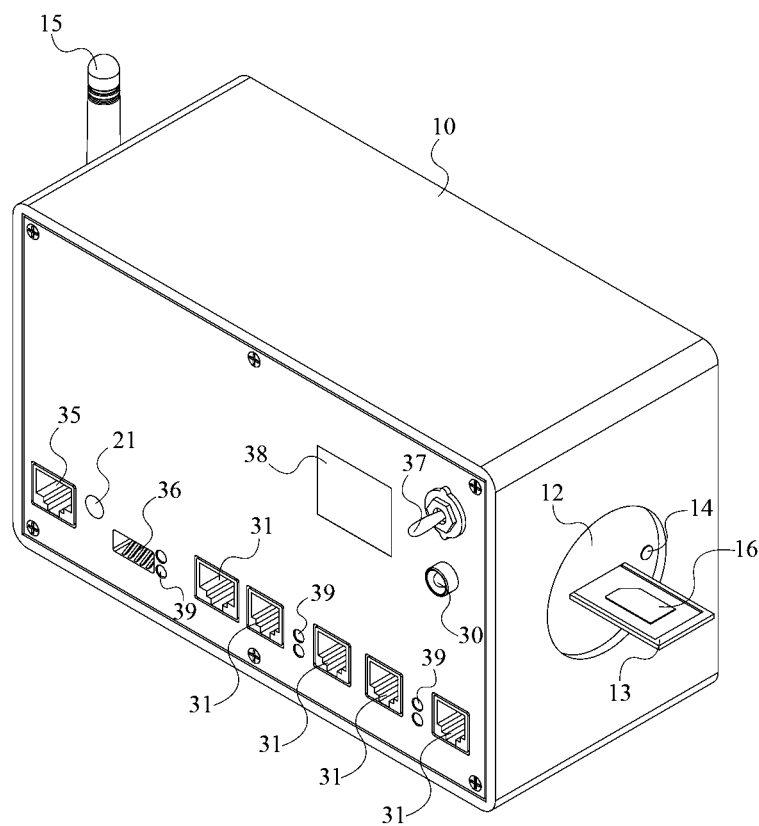
FIG. 2 is a perspective view of the RARO device with the access panel removed and the card dock extended.
Figure 5:
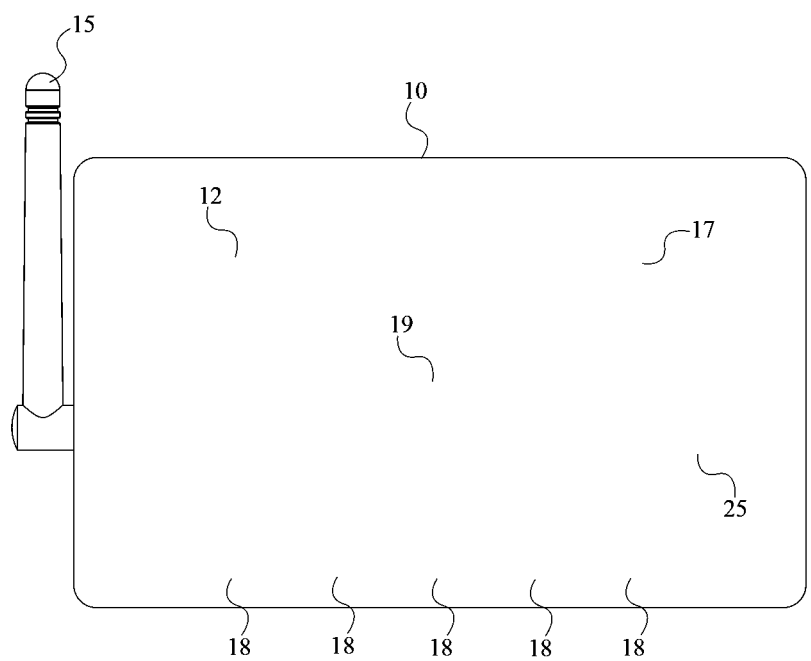
FIG. 5 is a front sectional view of the RARO device.
Figure 9:
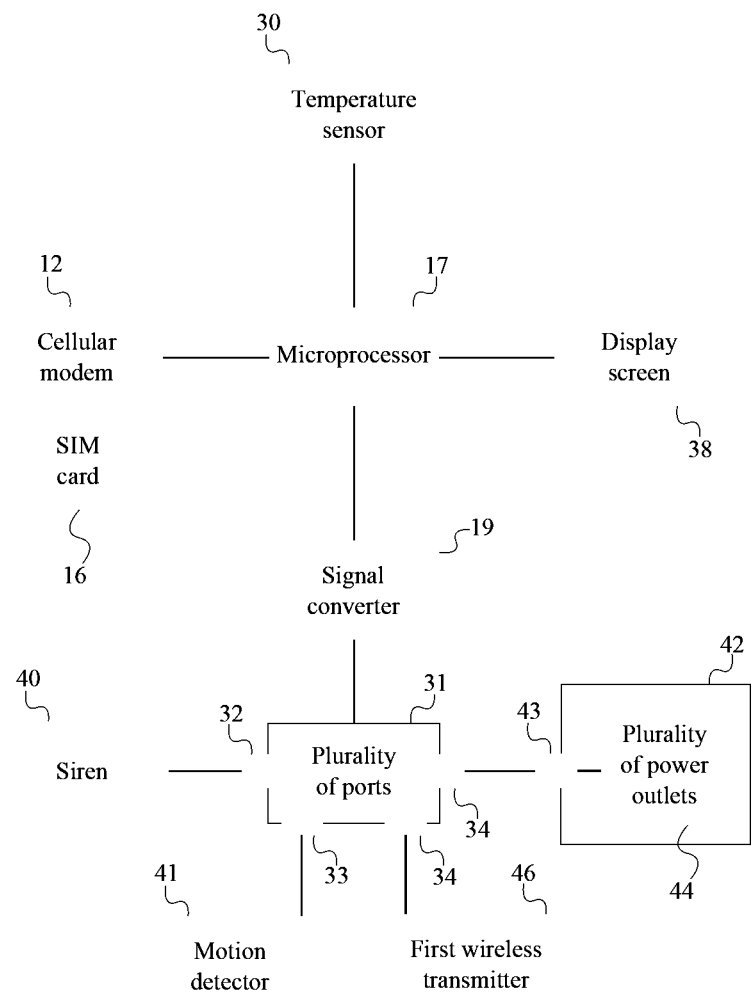
FIG. 9 is a diagram depicting the electronic connections between the microprocessor and other components of the RARO device.

In reference to FIG. 1-2, the RARO device comprises a device case 10, a cellular modem 12, a subscriber identity module (SIM) card 16, a microprocessor 17, a power assembly 20, a power switch 37, a temperature sensor 30, and a plurality of ports 31. The cellular modem 12 and the microprocessor 17 are positioned within the device case 10, as shown in FIG. 5, while the power switch 37, the temperature sensor 30, and the plurality of ports 31 are positioned into the device case 10. The microprocessor 17 housed in the RARO device is capable of reading SMS commands received through the cellular modem 12 and translating said SMS commands into electronic signals used to control devices connected to the RARO device through the plurality of ports 31. Thus, the cellular modem 12, the temperature sensor 30, and the plurality of ports 31 are electronically connected to the microprocessor 17, as shown in FIG. 9.

The cellular modem 12 allows the RARO device to communicate with the at least one user device and comprises an antenna 15. The antenna 15 is pivotally connected to the device case 10, such that the antenna 15 can be rotated in order to determine the optimal position for broadcasting and receiving radio signals. In the preferred embodiment of the present invention, the antenna 15 is positioned on one side of the device case 10, however, the antenna 15 can be positioned anywhere about the device case 10. Radio frequencies used to transmit data are received by the cellular modem 12 through the antenna 15. The received data is then sent to the microprocessor 17 where it is read and interpreted. Similarly, the microprocessor 17 receives electrical signals from connected devices and uses said signals to create notifications which are sent to the at least one user device via the cellular modem 12.

The antenna 15 may also be retractable as to adjust and increase the reception of radio signals.

In reference to FIG. 2, the cellular modem 12 further comprises a card dock 13, into which the SIM card 16 is positioned. The card dock 13 slidably engages the cellular modem 12, such that the SIM card 16 can be removed or replaced if desired. In the preferred embodiment of the present invention, the device case 10 comprises an access panel 11 that can be removed in order to access the cellular modem 12 within the device case 10. An eject button 14, adjacent to the card dock 13, can be pressed in order to release the card dock 13 from the cellular modem 12, once the access panel 11 has been removed, in order to access the SIM card 16. When the SIM card 16 is positioned into the card dock 13 and the card dock 13 is positioned into the cellular modem 12, the SIM card 16 is electronically connected to the cellular modem 12.

The SIM card 16 provides the RARO device with a unique phone number, while the cellular modem 12 allows the RARO device to communicate with other electronic devices across the radio tower network via SMS messages sent to and from the unique phone number. The SIM card 16 can be of any type, including but not limited to, a full-size SIM card, mini-SIM card, micro-SIM card, or nano-SIM card. The cellular modem 12 can be designed to accept a single SIM card type or multiple SIM card types. If acceptance of multiple SIM card types is desired, then the card dock 13 may be designed to accept multiple SIM card types, or an adapter for the card dock 13 may be provided in order to allow the use of multiple types of SIM cards. The SIM card 16 may be provided at the time of manufacture or can be installed after purchase. Installing the SIM card 16 after purchase allows a user to utilize their same cell phone service provider by adding an additional phone line to their existing service contract for the SIM card 16.

In the preferred embodiment of the present invention, the temperature sensor 30 is located about the front panel of the device case 10, although the temperature sensor 30 can be located anywhere about the device case 10. The temperature sensor 30 is capable of recording the ambient temperature of the current location of the RARO device. The temperature sensor 30 takes temperature measurements on an as needed basis (i.e. when a SMS command is sent to the RARO device). In another embodiment of the present invention, the temperature sensor 30 constantly records the temperature at predetermined intervals. Temperature information can then be stored on the microprocessor 17 of the RARO device and exported to another device, or sent directly to the at least one user device.

Figure 10:
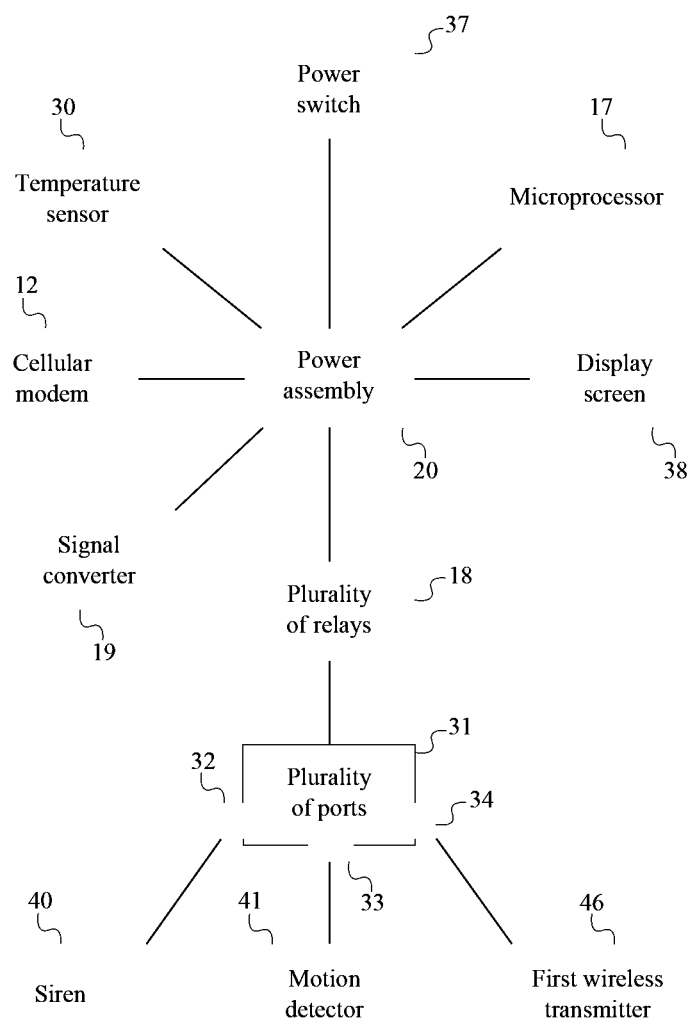
FIG. 10 is a diagram depicting the electrical connections between the power assembly and other components of the RARO device.

The RARO device may further comprise a display screen 38 that is used to display the ambient temperature recorded by the temperature sensor 30. Electrical signals are sent from the temperature sensor 30 to the microprocessor 17 indicating the ambient temperature, and in turn electrical signals are sent from the microprocessor 17 to the display screen 38 in order to display the ambient temperature. Thus, the display screen 38 is electronically connected to the microprocessor 17, as shown in FIG. 9. The display screen 38 is also electrically connected to the power assembly 20, as depicted in FIG. 10, such that the power assembly 20 supplies current to power the display screen 38. The display screen 38 is positioned through the front panel of the device case 10, such that the display screen 38 can readily be viewed by an individual. It is also possible for the display screen 38 to be used to display any other type of information in regards to electronic devices connected to the RARO device through the plurality of ports 31.

The plurality of ports 31 are located through the front panel of the device case 10. However, it is also possible for the plurality of ports 31 to be located anywhere about the device case 10. The plurality of ports 31 function as both inputs and outputs for controlling and monitoring electronic devices. In the preferred embodiment of the present invention, the plurality of ports 31 can provide one of three input types and one of two output types. The available input types are contact closure, high/low voltage level, and precision voltage range, while the available output types are contact closure and precision voltage range. It is also possible for the plurality of ports 31 to provide any number of other input types and output types. The plurality of ports 31 can be designed to receive cables of any type; particularly cables having a registered jack (RJ) plug type. In the preferred embodiment of the present invention, the plurality of ports 31 are designed to receive either RJ-11 cable or RJ-45 category-5 cable. Additionally, in the preferred embodiment of the present invention there are four opto-coupled ports for use with infrared or radar alarm detectors, however, it is possible for more or less opto-coupled ports to be used.

Each of the plurality of ports 31 is electronically connected to the microprocessor 17, as depicted in FIG. 9, such that electronic devices connected to the plurality of ports 31 can be controlled and monitored via SMS commands. For example, if a speaker is connected to a specific port 34 of the plurality of ports 31, then commands can be sent to the microprocessor 17 to verify the current volume level, adjust the volume level, adjust the speaker settings, etc. Each of the plurality of ports 31 is also electrically connected to the power assembly 20, as depicted in FIG. 10, such that current can be supplied to the electronic devices connected to the plurality of ports 31. In the preferred embodiment of the present invention, each of the plurality of ports 31 serves as a twelve volt power supply.

In reference to FIG. 5, a plurality of relays 18 is positioned within the device case 10 and each of the plurality of relays 18 is electrically connected to the plurality of ports 31 in order to turn connected electronic devices on or off, as shown in FIG. 10. The plurality of relays 18 can be used to open or close the circuit between the microprocessor 17 and the plurality of ports 31 in order to regulate current to the connected devices. The open or closed position of each of the plurality of relays 18 is dictated by the microprocessor 17. In the preferred embodiment of the present invention, the plurality of relays 18 is specifically five relays, each with a two amp maximum, potential free, switching capability. More than one relay may be used for each of the plurality of ports 31. It is also possible for any other types of relays to be used.

In further reference to FIG. 5, a signal converter 19 is also positioned within the device case 10. The signal converter 19 is electronically connected in between the plurality of ports 31 and the microprocessor 17, as shown in FIG. 9, and is electrically connected to the power assembly 20, as shown in FIG. 10. In the preferred embodiment of the present invention, the signal converter 19 is a 12-bit analog to digital converter, however, it is possible for the signal converter 19 to be any other type of analog to digital converter. The signal converter 19 is used to convert analog signals from analog devices to digital signals that can be read and processed by the microprocessor 17, and vice versa. In the preferred embodiment of the present invention, there are two analog inputs, however, more or less may be used. The signal converter 19 can be configured remotely by the at least one user device or on location using a computer via the plurality of ports 31. The signal converter 19 also has an internal voltage reference source for converting analog and digital signals.

The plurality of indicator lights 39 is located on the front panel of the device case 10, although the plurality of indicator lights 39 can be located anywhere about the device case 10. In the preferred embodiment of the present invention, each of the plurality of indicator lights 39 is a light emitting diode, however, any light source can be used. The plurality of lights can use any number of colors to indicate any number of factors such as power being supplied to a port, an inactive port, a malfunctioning port, etc.

Figure 4:
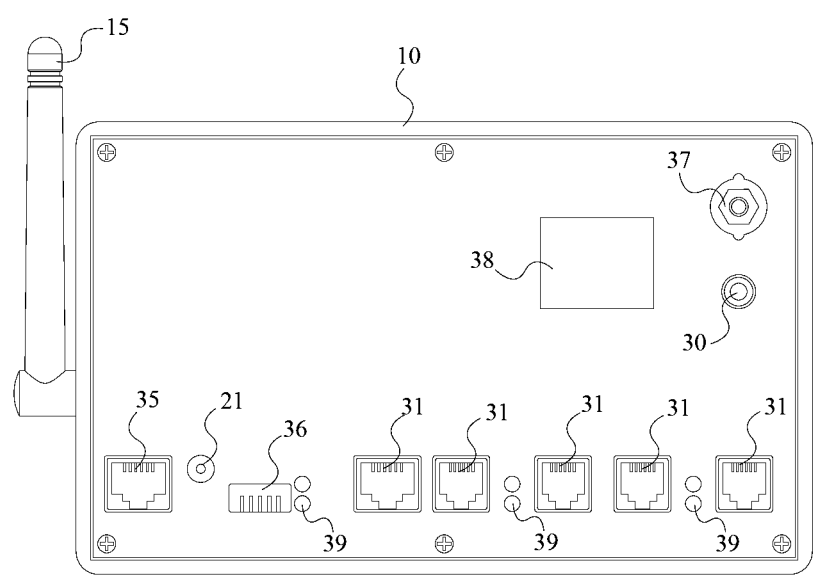
FIG. 4 is a front elevational view of the RARO device.

In reference to FIG. 4, the plurality of ports 31 also comprises a computer consol input 35 and a program update input 36. The computer consol input 35 is designed to receive a RJ-45 category-5 cable, although the computer consol input 35 can be designed to receive any other type of cable. The computer consol input 35 allows a user to connect a computer, or similar electronic device, to the RARO device in order to configure the signal converter 19. The computer consol input 35 can also be used to program other aspects of the RARO device. Additionally, the RARO device can be used to remotely control a computer connected to the RARO device through the computer consol input 35. In another embodiment of the present invention, the RARO device may collect data that can then be downloaded to a computer via the computer consol input 35. The program update input 36 is used to allow a manufacturer or third party device to connect to the RARO device in order to provide software updates, carry out performance tests, detect software/hardware malfunctions, etc.

In reference to FIG. 1 and FIG. 10, the power assembly 20 provides electrical current to the other components of the RARO device, and thus the power assembly 20 is electrically connected to the cellular modem 12, the microprocessor 17, the temperature sensor 30, and the plurality of ports 31. The power assembly 20 comprises a power input 21 and a power cable 23. The power input 21 is positioned into the device case 10. In the preferred embodiment of the present invention, the power input 21 is positioned into a front panel of the device case 10, however, the power input 21 can be positioned anywhere about the device case 10. The power cable 23 comprises a power connector 22 and a wall wart 24, which are positioned opposite each other along the power cable 23. The power connector 22 is positioned into the power input 21, while the wall wart 24 is inserted into a power outlet. Together, the power input 21 and the power cable 23 supply current from the wall outlet into which the wall wart 24 is inserted. In the preferred embodiment of the present invention the wall wart 24 provides a positive twelve volt, direct current power supply, however, any type of power supply may be used to power the RARO device.

In reference to FIG. 5, the power assembly 20 further comprises a battery supply 25. The battery supply 25 is positioned within the device case 10 and provides a back-up power supply for the RARO device in the event that electrical current cannot be supplied by the power outlet. The battery supply 25 can comprise any number of batteries and any type of batteries. If rechargeable batteries are used, then they may be recharged through the power input 21 and the power cable 23 once power has returned to the power outlet. An alarm message may be sent to the user when current to the power input 21 has been disconnected or has returned. It is also possible for the RARO device to utilize only the battery supply 25 or only the combination of the power input 21 and the power cable 23.

In reference to FIG. 10, the power switch 37 is also electrically connected to the power assembly 20 and is used to regulate the flow of electrical current, by opening or closing the electrical circuit within the device case 10, in order to turn the RARO device on or off. Turning the RARO device off allows the user to safely remove the SIM card 16, connect the RARO device to other devices, perform maintenance, etc. without any current running through the electrical circuit of the RARO device. In the preferred embodiment of the present invention, the power switch 37 is located on the front panel of the device case 10, however, the power switch 37 can be located anywhere about the device case 10. Additionally, the power switch 37 can be any type of switch, push button, key turn switch, etc. used for opening and closing an electrical circuit.

Figure 6:
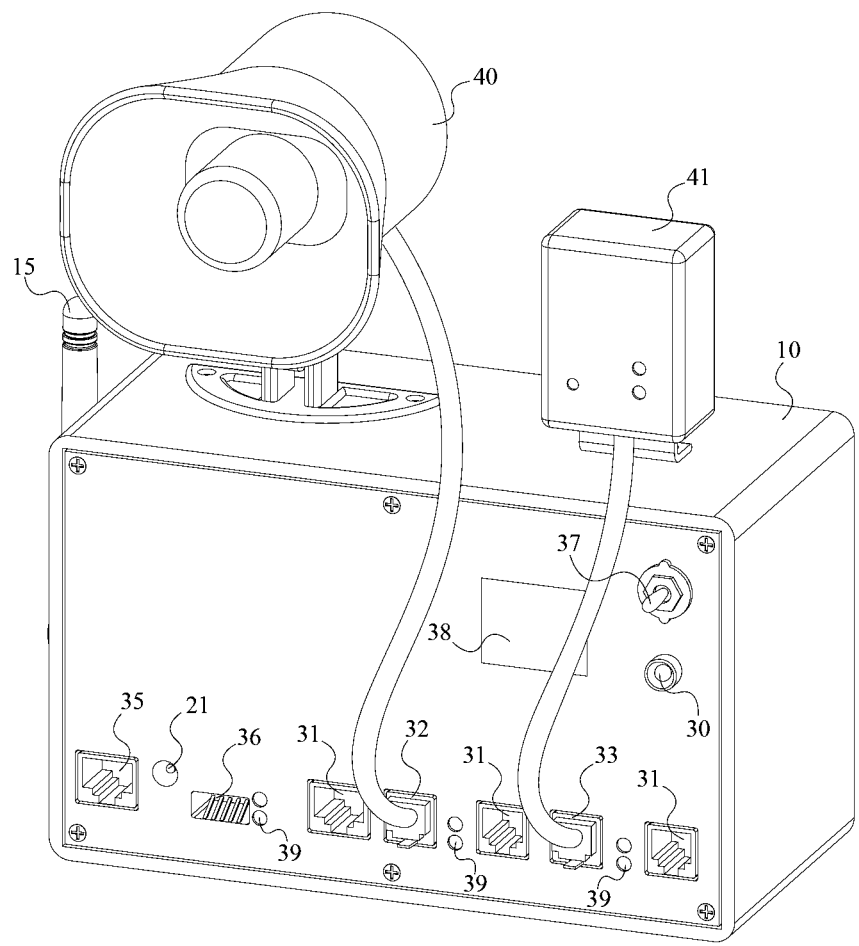
FIG. 6 is a perspective view of the RARO device, wherein the RARO device includes a siren and a motion detector.

In reference to FIG. 6, in one embodiment of the present invention, the RARO device further includes a siren 40 and a motion detector 41 that are connected to the plurality of ports 31. The siren 40 is connected to a first port 32 of the plurality of ports 31, while the motion detector 41 is connected to a second port 33 of the plurality of ports 31. The siren 40 is electronically connected to the microprocessor 17 and electrically connected to the power assembly 20 through the first port 32, as depicted in FIG. 9 and FIG. 10, respectively. The motion detector 41 is electronically connected to the microprocessor 17 and electrically connected to the power assembly 20 through the second port 33, as depicted in FIG. 9 and FIG. 10, respectively. The first port 32 supplies power to the siren 40 on an as needed basis, while the second port 33 constantly supplies power to the motion detector 41. When the motion detector 41 senses movement, a signal is sent to the microprocessor 17, which in turn sends a notification to the programmed user devices via the cellular modem 12. The user can then send a SMS command to turn on the siren 40. Alternatively, the siren 40 can be automatically turned on by the microprocessor 17 upon receipt of the motion detector 41 signal. The motion detector 41 can also be used to turn on lights, appliances or any other device. The siren 40 can also be used as a fire alarm. When the temperature sensor 30 of the RARO device detects a temperature above a pre-determined value the siren 40 is activated. The siren 40 and motion detector 41 system can be used in any number of other ways and with any number of other devices in addition to the uses described above.

Figure 7:
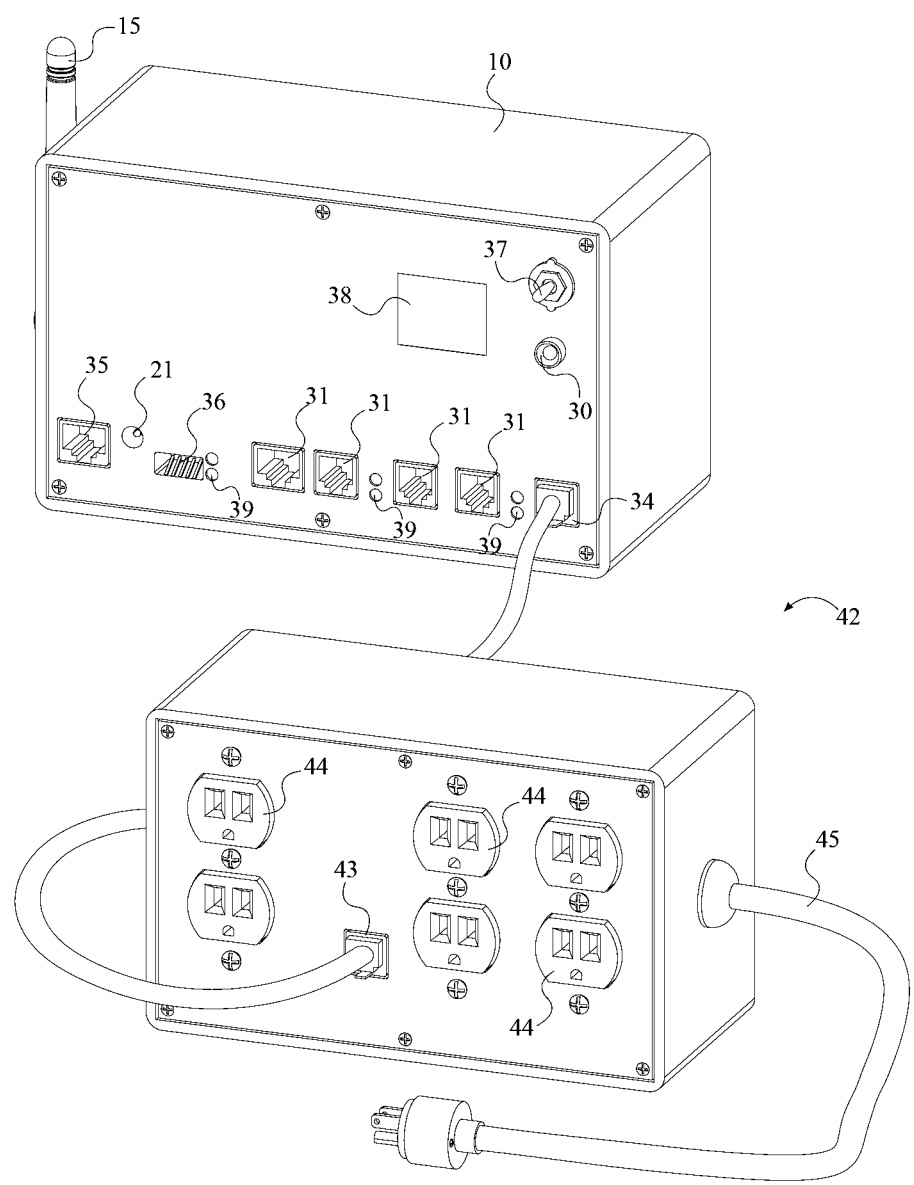
FIG. 7 is a perspective view of the RARO device, wherein the RARO device includes a power box.
Figure 11:
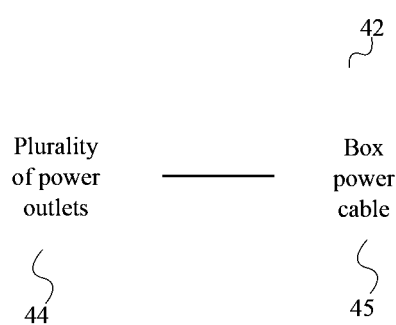
FIG. 11 is a diagram depicting the electrical connections within the power box.

In reference to FIG. 7 and FIG. 11, in another embodiment of the present invention, the RARO device further includes a power box 42 that is connected to a specific port 34 of the plurality of ports 31. The power box 42 comprises a box port 43, a plurality of power outlets 44, and a box power cable 45. The box power cable 45 is plugged into an existing wall outlet and is electrically connected to the plurality of power outlets 44 in order to provide electrical current to each of the plurality of power outlets 44. The power supplied to each of the plurality of power outlets 44 can be individually controlled by the RARO device via the wired connection between the box port 43 and the specific port 34. For example, the power box 42 having six power outlets could be used to provide power to six servers. The servers can then be power cycled individually or all at once by controlling the power supplied to each of the plurality of power outlets 44 using SMS commands sent to the RARO device.

Figure 8:
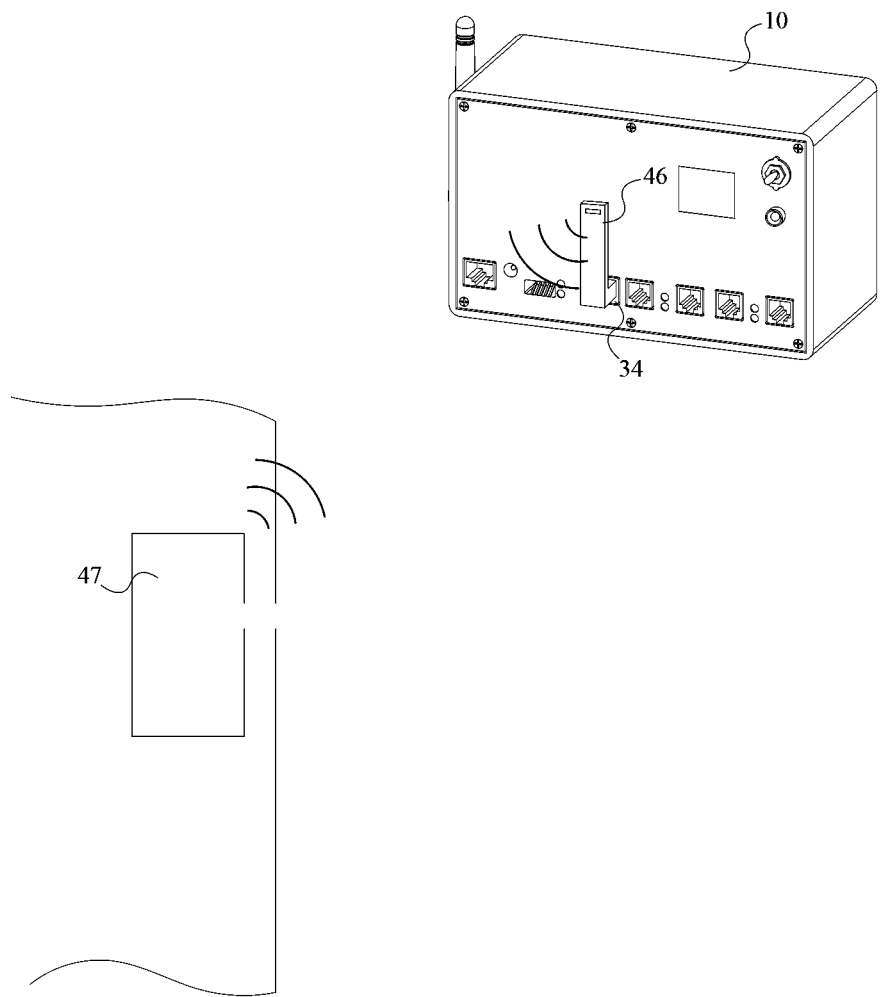
FIG. 8 is a perspective view of the RARO device, wherein the RARO device includes a first wireless transmitter and a second wireless transmitter.

In reference to FIG. 8, in yet another embodiment of the present invention, the RARO device includes a first wireless transmitter 46 and a second wireless transmitter 47. The first wireless transmitter 46 is connected to a specific port 34 of the plurality of ports 31, while the second wireless transmitter 47 can then be installed in any number of other electronic devices and is communicably coupled to the first wireless transmitter 46. The first wireless transmitter 46 is electrically connected to the power assembly 20 and electronically connected to the microprocessor 17 through the specific port 34, as depicted in FIG. 10 and FIG. 9, respectively. When connected to the specific port 34, the first wireless transmitter 46 relays commands between the microprocessor 17 and the second wireless transmitter 47. As an example, the second wireless transmitter 47 is installed in an electronic door lock. SMS commands to lock or unlock the door can be sent to the RARO device within the house or building. The lock or unlock command will then be relayed through the first wireless transmitter 46 to the second wireless transmitter 47 in order to lock or unlock the door. In a second example, the second wireless transmitter 47 is installed in a vehicle. When the vehicle is within range of the first wireless transmitter 46, SMS commands can be used to turn the car on and off, unlock doors, turn on lights, etc. In a third example, the second wireless transmitter 47 is installed in an emergency remote. The emergency remote has a single button that when pressed sends a wireless signal to the first wireless transmitter 46. Upon receiving the wireless signal, the first wireless transmitter 46 sends an electrical signal to the microprocessor 17. The microprocessor 17 then sends an emergency notification to the at least one user device. This is particularly useful for the elderly, such that they can readily call upon a caregiver in an emergency situation.

The following describes additional uses of the RARO device. The RARO device could be wired to an existing fire alarm system in a building. When the temperature sensor 30 detects a temperature above a pre-determined value, the microprocessor 17 will activate the fire alarm system. Notifications of the activated fire alarm are then sent to the appropriate user devices. The RARO device can also be connected to an existing thermostat connection. Normal thermostat functions can then be controlled remotely using SMS commands. In another use, a server is connected directly to the RARO device as opposed to being connected through a power box 42 in the above example. SMS commands can then be used to power cycle the server through the specific port 34. In yet another use, an analog water level sensor is connected to a specific port 34. The analog water sensor can be used to constantly monitor the water level of a container or can be used to trigger an alarm when the water level has reached a pre-determined level. The RARO device can be used with any number of other devices and for any number of other applications in addition to those described above.

Figure 12:
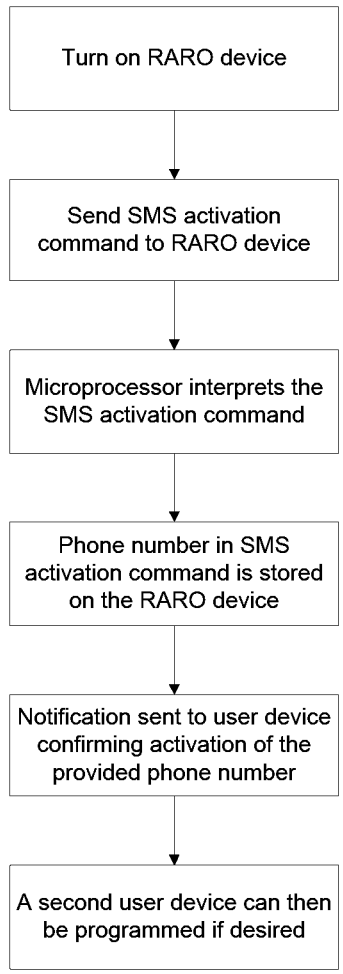
FIG. 12 is a flowchart describing the process of registering a phone number with the RARO device.

In reference to FIG. 12, a user must first program their number into the RARO device in order to send commands and receive notifications. First, the RARO device must be turned on by means of the power switch 37. The user then sends the following SMS activation command, indicated in quotes, via their user device: "Num1" followed by a space, followed by the phone number of a desired user device. The RARO device will then send a notification to the desired user device, via the cellular modem 12, confirming that the given phone number has been successfully programmed into the microprocessor 17 of the RARO device. The user can then send SMS commands and receive notifications using the desired user device. Subsequent phone numbers can be programmed into the microprocessor 17 of the RARO device using the "Num" command followed by the succeeding number, followed by a space, followed by the desired phone number. For example, a second number would be programmed by sending "Num2 8295559302", a third number would be programmed by sending "Num3 7285551029" and so on.

In the preferred embodiment of the present invention, subsequently added phone numbers can only be used to receive notifications, however, they may be able to send SMS commands in other embodiments of the present invention. The deliverance of notifications can be toggled on and off using the "Num#on" and "Num#off" commands; the "#" indicating the command number used to activate the associated user device. It is also possible for any other text to be used for the SMS commands. FIG. 13 shows several examples of SMS commands, however, it is to be noted that any number of other SMS commands may be used to control various electronic devices. In the preferred embodiment of the present invention, two phone numbers can be programmed into the RARO device, while a third phone number is pre-programmed. The third phone number allows backdoor access by the manufacturer or by a third party for data collection, remote assistance, etc.

Although the invention has been explained in relation to its preferred embodiment, it is to be understood that many other possible modifications and variations can be made without departing from the spirit and scope of the invention as hereinafter claimed.

What is claimed is:

1. A remote acquisition and remote operation (RARO) device comprises:
   a device case;
   a cellular modem;
   a subscriber identity module (SIM) card;
   a microprocessor;
   a power assembly;
   a temperature sensor;
   the cellular modem comprises a card dock;
   the cellular modem and the microprocessor being positioned within the device case;
   the temperature sensor being positioned into the device case;
   the cellular modem, the microprocessor, and the temperature sensor being electrically connected to the power assembly;
   the cellular modem and the temperature sensor being electronically connected to the microprocessor;
   the SIM card being positioned in the card dock;
   the card dock slidably engaging the cellular modem;
   the card dock being positioned into the cellular modem;
   the SIM card being electronically connected to the cellular modem;
   a plurality of ports;
   the plurality of ports being positioned into the device case;
   the plurality of ports being electrically connected to the power assembly; and
   the plurality of ports being electronically connected to the microprocessor;
   a siren;
   a motion detector;
   the plurality of ports comprises a first port and a second port;
   the siren being electronically connected to the microprocessor through the first port;
   the siren being electrically connected to the power supply through the first port;
   the motion detector being electronically connected to the microprocessor through the second port; and
   the motion detector being electrically connected to the power supply through the second port.

2. The RARO device as claimed in claim 1 comprises:
   the cellular modem further comprises an antenna; and
   the antenna being pivotally connected to the device case.

3. The RARO device as claimed in claim 1 comprises:
   a display screen;
   the display screen being positioned through the device case;
   the display screen being electrically connected to the power supply; and the display screen being electronically connected to the microprocessor.

4. The RARO device as claimed in claim 1 comprises:
the power assembly comprises a power input and a power cable;
the power input being positioned into the device case; and
the power cable being positioned into the power input.

5. The RARO device as claimed in claim 1 comprises:
the power assembly comprises a battery supply; and
the battery supply being positioned within the device case.

6. The RARO device as claimed in claim 1 comprises:
a power switch;
the power switch being positioned into the device case; and
the power switch being electrically connected to the power assembly.

7. The RARO device as claimed in claim 1 comprises:
a plurality of relays;
the plurality of relays being positioned within the device case; and
the plurality of relays being electrically connected to the plurality of ports.

8. The RARO device as claimed in claim 1 comprises:
a signal converter;
the signal converter being positioned within the device case;
the signal converter being electronically connected in between the plurality of ports and the microprocessor; and
the signal converter being electrically connected to the power assembly.

9. The RARO device as claimed in claim 1 comprises:
a power box;
the plurality of ports comprises a specific port;
the power box comprises a box port, a plurality of power outlets, and a box power cable;
the plurality of power outlets being electrically connected to the box power cable;
the box port being electronically connected to the specific port; and
the plurality of power outlets being electronically connected to the microprocessor through the box port and the specific port.

10. The RARO device as claimed in claim 1 comprises:
a first wireless transmitter;
a second wireless transmitter;
the plurality of ports comprises a specific port;
the first wireless transmitter being electrically connected to the power assembly through the specific port;
the first wireless transmitter being electronically connected to the microprocessor through the specific port; and
the second wireless transmitter being communicably coupled to the first wireless transmitter.

11. A remote acquisition and remote operation (RARO) device comprises:
a device case;
a cellular modem;
a subscriber identity module (SIM) card;
a microprocessor;
a power assembly;
a plurality of ports;
a temperature sensor;
a power switch;
the cellular modem comprises a card dock;
the power assembly comprises a power input, a power cable, and a battery supply;
the cellular modem, the microprocessor, and the battery supply being positioned within the device case;
the plurality of ports, the temperature sensor, the power switch, and the power input being positioned into the device case;
the cellular modem, the microprocessor, the plurality of ports, temperature sensor, and the power switch being electrically connected to the power assembly;
the cellular modem, the plurality of ports, and the temperature sensor being electronically connected to the microprocessor;
the SIM card being positioned in the card dock;
the card dock slidably engaging the cellular modem;
the card dock being positioned into the cellular modem;
the SIM card being electronically connected to the cellular modem;
the power cable being positioned into the power input;
a power box;
the plurality of ports comprises a specific port;
the power box comprises a box port, a plurality of power outlets, and a box power cable;
the plurality of power outlets being electrically connected to the box power cable;
the box port being electronically connected to the specific port; and
the plurality of power outlets being electronically connected to the microprocessor through the box port and the specific port.

12. The RARO device as claimed in claim 11 comprises:
the cellular modem further comprises an antenna; and
the antenna being pivotally connected to the device case.

13. The RARO device as claimed in claim 11 comprises:
a display screen;
the display screen being positioned through the device case;
the display screen being electrically connected to the power supply; and
the display screen being electronically connected to the microprocessor.

14. The RARO device as claimed in claim 11 comprises:
a plurality of relays;
the plurality of relays being positioned within the device case; and
the plurality of relays being electrically connected to the plurality of ports.

15. The RARO device as claimed in claim 11 comprises:
a signal converter;
the signal converter being positioned within the device case;
the signal converter being electronically connected in between the plurality of ports and the microprocessor; and
the signal converter being electrically connected to the power assembly.

16. The RARO device as claimed in claim 11 comprises:
a siren;
a motion detector;
the plurality of ports comprises a first port and a second port;
the siren being electronically connected to the microprocessor through the first port;
the siren being electrically connected to the power supply through the first port;
the motion detector being electronically connected to the microprocessor through the second port; and
the motion detector being electrically connected to the power supply through the second port.

17. The RARO device as claimed in claim 11 comprises:
a first wireless transmitter;

a second wireless transmitter;
the plurality of ports comprises a specific port;
the first wireless transmitter being electrically connected to the power assembly through the specific port;
the first wireless transmitter being electronically connected to the microprocessor through the specific port; and
the second wireless transmitter being communicably coupled to the first wireless transmitter.

\* \* \* \* \*